(12) United States Patent
Evans et al.

(10) Patent No.: US 7,454,915 B2
(45) Date of Patent: Nov. 25, 2008

(54) SUPER COOLER FOR A HEAT PRODUCING DEVICE

(75) Inventors: Nigel Evans, Sutton Coldfield (GB); William E. Hewlett, Burton on Trent (GB)

(73) Assignee: Production Resource Group L.L.C., New Windsor, NY (US)

( * ) Notice: Subject to any disclaimer, the term of this patent is extended or adjusted under 35 U.S.C. 154(b) by 0 days.

(21) Appl. No.: 11/358,987

(22) Filed: Feb. 21, 2006

(65) Prior Publication Data

US 2006/0150636 A1  Jul. 13, 2006

Related U.S. Application Data

(60) Continuation of application No. 10/794,285, filed on Mar. 4, 2004, now Pat. No. 7,000,417, which is a continuation of application No. 10/375,165, filed on Feb. 25, 2003, now Pat. No. 6,775,991, which is a continuation of application No. 10/128,774, filed on Apr. 22, 2002, now Pat. No. 6,523,353, which is a division of application No. 09/780,025, filed on Feb. 9, 2001, now Pat. No. 6,430,934.

(60) Provisional application No. 60/181,530, filed on Feb. 10, 2000.

(51) Int. Cl.
*F25B 21/02* (2006.01)
(52) U.S. Cl. ........................ 62/3.2; 62/259.2
(58) Field of Classification Search ............... 62/3.2, 62/3.3, 3.7, 259.2, 235.1
See application file for complete search history.

(56) References Cited

U.S. PATENT DOCUMENTS

| | | | | |
|---|---|---|---|---|
| 4,834,805 A | * | 5/1989 | Erbert | 136/246 |
| 4,838,032 A | * | 6/1989 | Maslaney et al. | 62/3.7 |
| 4,848,090 A | | 7/1989 | Peters | |
| 5,097,829 A | | 3/1992 | Quisenberry | |
| 5,515,682 A | | 5/1996 | Nagakubo et al. | |
| 5,609,032 A | | 3/1997 | Bielinski | |
| 5,793,452 A | | 8/1998 | Miyawaki | |
| 5,851,842 A | * | 12/1998 | Katsumata et al. | 438/9 |
| 5,912,773 A | | 6/1999 | Barnett et al. | |
| 5,953,151 A | | 9/1999 | Hewlett | |
| 6,012,291 A | | 1/2000 | Ema | |
| 6,098,408 A | | 8/2000 | Levinson et al. | |
| 6,208,087 B1 | | 3/2001 | Hughes et al. | |
| 6,224,216 B1 | | 5/2001 | Parker et al. | |
| 6,430,934 B2 | | 8/2002 | Evans et al. | |
| 6,523,353 B2 | | 2/2003 | Evans et al. | |
| 6,775,991 B2 | | 8/2004 | Evans et al. | |

\* cited by examiner

*Primary Examiner*—Melvin Jones
(74) *Attorney, Agent, or Firm*—Law Office of SC Harris

(57) ABSTRACT

A super cooler device including a thermo electric cooler on a digital micro mirror device.

22 Claims, 3 Drawing Sheets

SUPER COOLER FOR A HEAT PRODUCING DEVICE

CROSS-REFERENCE TO RELATED APPLICATIONS

This application is a continuation of U.S. application Ser. No. 10/794,258, filed Mar. 4, 2004 now U.S. Pat. No. 7,000,417, which is a continuation of U.S. application Ser. No. 10/375,165, filed Feb. 25, 2003, now U.S. Pat. No. 6,775,991, which is a continuation of U.S. application Ser. No. 10/128,774, filed Apr. 22, 2002, now U.S. Pat. No. 6,523,353, which is a divisional of U.S. application Ser. No. 09/780,025, filed Feb. 9, 2001, now U.S. Pat. No. 6,430,934, which claims the benefit of U.S. provisional application Ser. No. 60/181,530 filed Feb. 10, 2000.

SUMMARY

The present application relates to cooling of a heat producing device, using a thermoelectric cooler arranged as a super cooler. More specifically, the present application teaches cooling of a device, such as a digital mirror device, which requires a specified temperature gradient across the device, using a supercooled element.

BACKGROUND

Electronic devices often have specified cooling requirements. One device that has specific cooling requirements is a digital micromirror device ("DMD") available from Texas Instruments ("TI"). The manufacturer of this device has specified a maximum overall temperature for the device and also a specified maximum temperature gradient between the front and rear faces of the device during operation.

For example, the temperature of the specific DMD used in this application needs to be kept below 55☐ C., however, in this application it is desirable to keep the device at or below ambient. This may allow operation in an ambient environment up to 55☐ C., such as may be encountered in a stage theater or studio environment. The temperature differential between the front and rear of the DMD cannot exceed 15☐. Besides the heat from the operation of the DMD itself, large amounts of heat from a high intensity light source must be dissipated.

BRIEF DESCRIPTION OF THE DRAWINGS

These and other aspects will now be described in detail with reference to the accompanying, wherein.

DETAILED DESCRIPTION

According to the present system, a "supercooler" device, is used to monitor and control the temperature of a device which can control light on a pixel-by-pixel basis, e.g. a digital mirror device (DMD).

Figure 1:
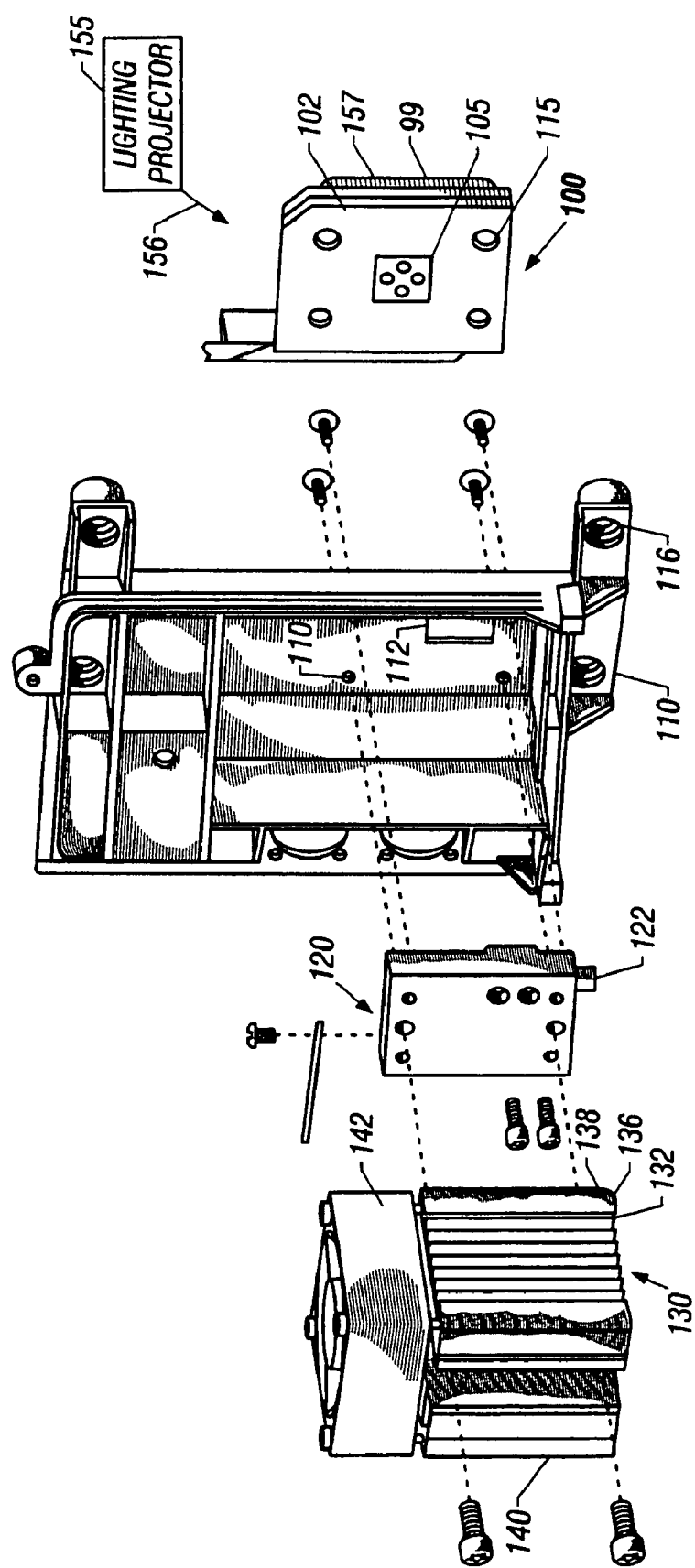
FIG. 1 shows an exploded diagram of the parts making up the supercooler assembly.

The mechanical structure of the supercooling assembly is shown in FIG. 1. The pixel element is a DMD 99, which forms part of a DMD assembly 100. As shown, a thermal connection 105 to the DMD 99 is provided. A lighting projector 155 projects light 156 on the front surface 157 thereof.

A cold plate 120 is assembled to a mounting bracket 110 in a manner which allows minimal thermal transfer between the two components. The DMD is attached directly to the cold plate 120, hereby allowing maximum thermal transfer between the DMD and cold plate 120, but minimal thermal transfer to the mounting bracket 110. The rear surface of the cold plate 120 is directly connected to one side of the thermoelectric device 130, and the other side of the thermoelectric device is connected to a heat sink/fan assembly 140.

Insulating foam gaskets are fitted around the DMD rear stud, the cold plate, and the thermoelectric device in order to isolate them from the outside ambient air. This improves the efficiency of the cooling system by eliminating the effects of condensation and properly controlling the flow of heat from the DMD to the cold plate, through the thermoelectric device, and into the heat sink/fan assembly.

The thermoelectric cooler element 130 operates as conventional to produce one cold side 131 and one hot side 132. The hot side is coupled to the heat sink/fan assembly 140 to dissipate the heat. In a preferred mode, the heat sink/fan assembly is columnar is shape, with a substantially square cross section. This facilitates using a square shaped fan housing 142. The square shaped fan unit allows the maximum use of the space for a fan, whose blades usually follow a round shape. Any type of cooling fan, however can be used.

The DMD assembly 100 has an extending rear stud 105 which is covered with thermal grease. This stud extends though a hole 112 in the bracket assembly 110.

The plate 120 is actively cooled, and hence becomes a "cold plate". The active cooling keeps the metal plate at a cooled temperature, and the thermal characteristics of the plate material allow the heat flowing into the plate from the DMD to be evenly distributed throughout the entire plate. The plate is preferably about ¼" to ⅜" in thickness, and of comparable outer size to the thermal contact area of the thermoelectric cooler element 130. This allows the localized and concentrated heat at the rear stud of the DMD to be evenly dissipated through the cold plate and then efficiently transferred through the full surface area of the thermoelectric cooler element. As shown, the assembly employs thermal insulation techniques such as fiber/plastic sleeves and washers in the mounting of components, in order to prevent heat transfer via mounting screws etc. Since this heat transfer could be uncontrolled, it could otherwise reduce the cooling efficiency.

Figure 2:
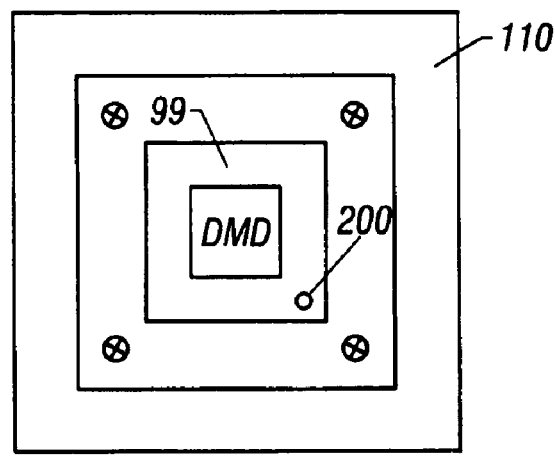
FIG. 2 shows the rear of the DMD and parts which are assembled to the DMD.

The front of the DMD is shown in FIG. 2. Temperature sensor 200 is mounted to have a fast response to temperature changes. A second temperature sensor 122 is mounted to the cold plate 120 and effectively measures the temperature of the rear of the DMD 99. This second temperature sensor 122 therefore monitors the back temperature.

The hot side 132 of the thermoelectric cooler is coupled to a heat sink assembly 130. The heat sink assembly 140 includes a heat sink element 140. As shown, the device has fins and a top-located cooling fan 142.

Figure 3:
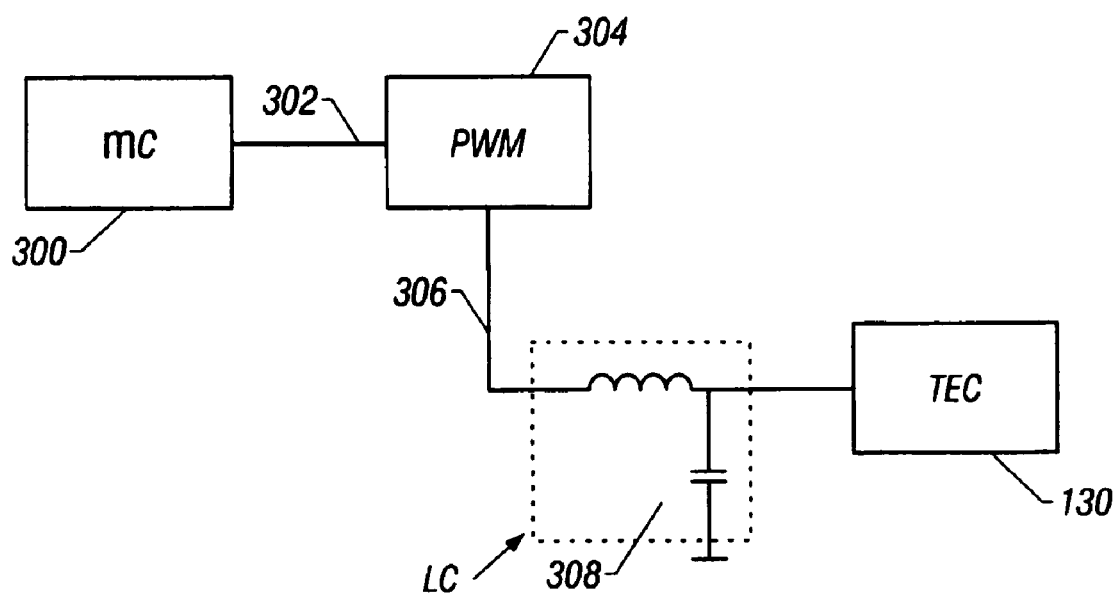
FIG. 3 shows a circuit for driving a thermoelectric cooler.

A block diagram of the control system is shown in FIG. 3. Controller 300 operates in a closed loop mode to maintain a desired temperature differential across the sensors 122,200.

One important feature of the present application is that the thermoelectric cooler is controlled to maintain the temperature of the DMD at the desired limits. These limits are set at a target of 16☐ C. on the front, and a differential no greater than 15☐ between front and rear. The thermoelectric cooler is controlled using very low frequency or filtered pulse width modulation. In a first embodiment, the controlling micro controller 300 produces an output 302, e.g., digital or analog. This drives a pulse width modulator 304. The output of the pulse width modulator is a square wave 306 or a signal close to a square wave, with sufficient amplitude and power to produce the desired level of cooling down the thermoelectric cooler. The square wave is coupled to an LC filter 308 which has a time constant effective to smooth the 20 KHz switching frequency. The output to the thermoelectric cooler is therefore a DC signal. This drives the thermoelectric cooler 130 and causes it to produce a cooling output. In a second embodiment, the LC filter is removed and the TEC is driven directly by the square wave 306 at a lower frequency, e.g. 1 Hz.

Figure 4:
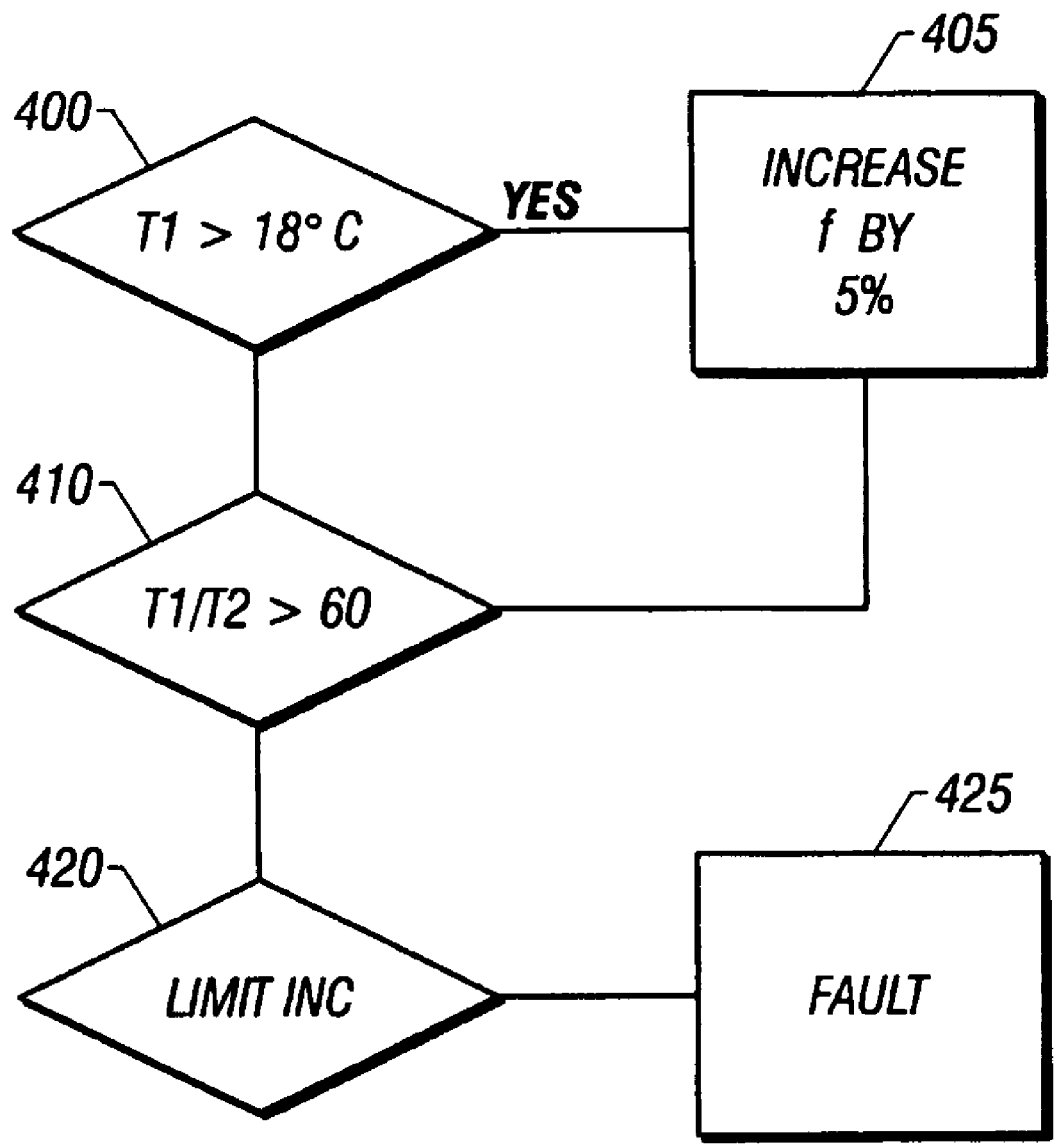
FIG. 4 shows a flowchart of operation.

The microcontroller operates according to the flowchart of FIG. 4. Step 400 determines if the temperature of the first temperature sensor T1 is greater than 16☐. If so, the output to the TEC remains "on", resulting in further cooling. When the temperature falls below 16☐, the drive to the TEC is switched off. The sample period is approximately ½ second between samples.

At 410, the system checks temperature of the first sensor (T1) and of the second sensor (T2) to determine if the differential is greater than 15☐. If so, the output is switched "on". Step 420 indicates a limit alarm, which represents the time of increase if the rate of change continues. If the rate of change continues to increase, as detected at step 420, a fault is declared at step 425. This fault can cause, for example, the entire unit to be shut off, to reduce the power and prevent permanent damage.

Other embodiments are contemplated.

What is claimed:

1. A system, comprising:
    a first semiconductor chip, having a first active surface adapted for receiving energy from a light source, and having a second surface, opposite said first surface;
    a mounting part, connected to a first portion of said second surface, and having parts for structurally mounting said first semiconductor chip,
    an insulating connection between said mounting part and said first semiconductor chip comprising at least one item of insulation between said second surface and said mounting part to reduce heat flow therebetween; and
    a cooling part, connected to at least a second portion of said second surface which is a different portion than said first portion, and thermally connected to said second portion of said second surface, said cooling part receiving heat from said first semiconductor chip.

2. A system as in claim 1, further comprising an active cooler, coupled to said cooling part.

3. A system as in claim 1, wherein said mounting part includes a hole formed therein, and said at least one other portion extending through said hole.

4. A system as in claim 3, wherein said mounting part is located between said first semiconductor chip and said cooling part.

5. A system as in claim 1, wherein the connection between said semiconductor chip and said mounting part includes insulating gaskets covering said at least one portion.

6. A system as in claim 1, wherein said first semiconductor chip is a digital mirror device.

7. A system as in claim 4, further comprising a plurality of insulating connector parts mounting said first semiconductor chip to said mounting part.

8. A system as in claim 7, wherein said insulating connector parts include sleeves and washers formed of one of fiber or plastic.

9. A method, comprising:
    projecting radiation to a front surface of a semiconductor chip;
    mounting the semiconductor chip by attaching to only a first portion of a rear surface of said semiconductor chip using a mounting device, while insulating between said rear surface and said mounting device; and
    cooling only a second portion of said rear surface of said semiconductor chip different than said first portion of said semiconductor chip, using a cooling structure that is separate from the mounting device.

10. A method as in claim 9, wherein said cooling comprises cooling said second portion through a hole in the mounting device.

11. A method as in claim 9, wherein said mounting comprises using at least one heat insulating gasket between said first portion and said mounting device.

12. A method as in claim 11, wherein said mounting further comprises using at least one insulating connector part to mount said semiconductor chip to said mounting part.

13. A method as in claim 9, wherein said mounting part is located between said cooling structure and said semiconductor chip.

14. A method as in claim 10, wherein said cooling comprises actively cooling said second portion using said cooling structure.

15. A method as in claim 14, wherein said actively cooling comprises using a thermoelectric device for said active cooling.

16. A method as in claim 9, further comprising insulating said cooling structure to minimize condensation.

17. An apparatus, comprising:
    a semiconductor chip having a first active surface that receives projected light thereon, and a second inactive surface opposite said first active surface;
    a mounting structure, connected to said semiconductor chip and thermally insulated relative thereto, and operating to support structurally said semiconductor chip while remaining thermally insulated from said first semiconductor chip, said mounting structure including a hole therein;
    said semiconductor chip having a second portion having substantially the same outer shape as said hole, and extending through said hole; and
    a cooling part, thermally in contact with said second portion, and coupled to said mounting structure but thermally insulated from said mounting structure, said cooling part operating to cool said first semiconductor chip.

18. An apparatus as in claim 17, wherein said hole is substantially square in section.

19. An apparatus as in claim 17, further comprising at least one insulating gasket, between said semiconductor chip and said mounting structure.

20. An apparatus as in claim 19, further comprising at least one insulating washer between said semiconductor chip and said mounting structure.

21. An apparatus as in claim 19, further comprising at least one insulated sleeve between said semiconductor chip and said mounting structure.

22. An apparatus as in claim 17, further comprising at least one insulating cover covering said cooling part.

* * * * *